(12) United States Patent
Waltermann et al.

(10) Patent No.: US 9,274,174 B2
(45) Date of Patent: Mar. 1, 2016

(54) PROCESSOR TAP SUPPORT FOR REMOTE SERVICES

(71) Applicant: Lenovo (Singapore) Pte. Ltd., Singapore (SG)

(72) Inventors: Rod D. Waltermann, Rougemont, NC (US); Nagananda Chumbalkar, Cary, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 168 days.

(21) Appl. No.: 14/014,155

(22) Filed: Aug. 29, 2013

(65) Prior Publication Data

US 2015/0067424 A1    Mar. 5, 2015

(51) Int. Cl.
*G01R 31/28*  (2006.01)
*G01R 31/3185*  (2006.01)

(52) U.S. Cl.
CPC  *G01R 31/318536* (2013.01); *G01R 31/318555* (2013.01)

(58) Field of Classification Search
CPC ............... G01R 31/318536; G01R 31/318555
USPC ......................................................... 714/726
See application file for complete search history.

(56) References Cited

U.S. PATENT DOCUMENTS

| 5,781,560 | A  | * | 7/1998  | Kawano et al. ............... 714/727 |
| 6,983,441 | B2 | * | 1/2006  | Wescott ........................ 716/117 |
| 7,193,877 | B1 | * | 3/2007  | Yelluru ........................ 365/49.1 |
| 7,657,807 | B1 | * | 2/2010  | Watkins et al. ............... 714/727 |
| 7,661,048 | B2 | * | 2/2010  | Gomez et al. ................ 714/727 |
| 8,325,633 | B2 | * | 12/2012 | Archer et al. ................. 370/282 |
| 2014/0316603 | A1 | * | 10/2014 | Lederer et al. ............... 700/298 |

* cited by examiner

*Primary Examiner* — David Ton
(74) *Attorney, Agent, or Firm* — Brian J. Pangrle

(57) ABSTRACT

An apparatus can include a circuit board; a processor chip mounted to the circuit board that includes a Test Access Port (TAP); a controller mounted to the circuit board that includes a port operatively coupled to the Test Access Port (TAP) of the processor chip; and a network interface operatively coupled to the controller. Various other apparatuses, systems, methods, etc., are also disclosed.

19 Claims, 10 Drawing Sheets

PROCESSOR TAP SUPPORT FOR REMOTE SERVICES

TECHNICAL FIELD

Subject matter disclosed herein generally relates to technologies and techniques for support services.

BACKGROUND

Information handling devices include various components where one or more of the components may experience faults. Various technologies and techniques described herein may, for example, provide for monitoring, fault detection or other support services.

SUMMARY

An apparatus can include a circuit board; a processor chip mounted to the circuit board that includes a Test Access Port (TAP); a controller mounted to the circuit board that includes a port operatively coupled to the Test Access Port (TAP) of the processor chip; and a network interface operatively coupled to the controller. Various other apparatuses, systems, methods, etc., are also disclosed.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing general principles of the implementations. The scope of the described implementations should be ascertained with reference to the issued claims.

Figure 1:
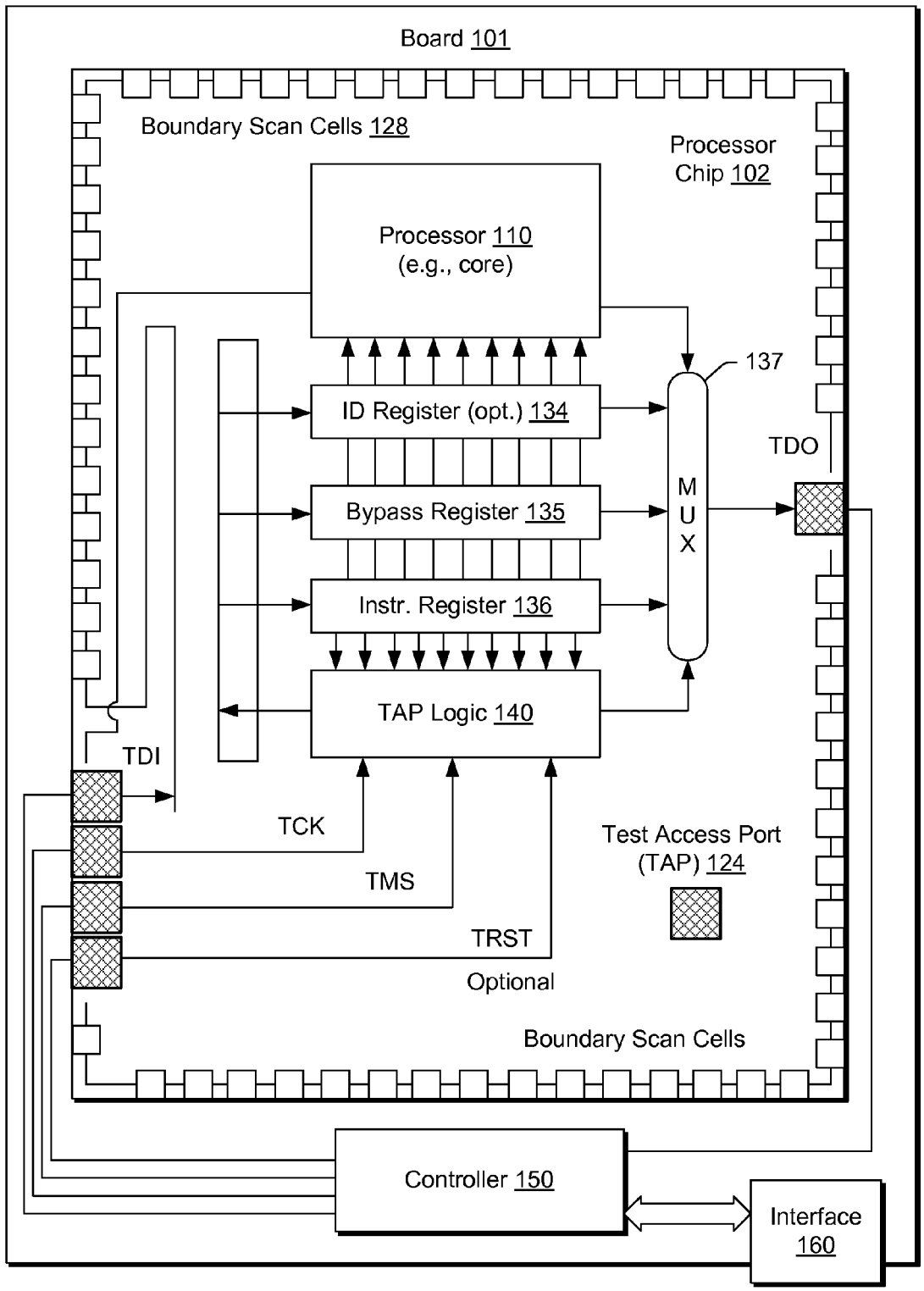
FIG. 1 is a diagram of an example of a board that includes circuitry.

FIG. 1 shows an example of a board 101 (e.g., a circuit board) that includes processor chip 102 that includes a processor 110 as well as a Test Access Port (TAP) architecture that includes a TAP 124, boundary scan cells 128, an optional ID register 134, a bypass register 135, an instruction register 136, a multiplexer 137 and TAP logic 140 and that includes a controller 150 and an interface 160. As shown in the example of FIG. 1, the controller 150 is operatively coupled to the TAP 124. As an example, information may be received by the controller 150 via the interface 160 and/or transmitted by the controller 150 via the interface 160. As an example, the controller 150 may instruct the TAP architecture via the TAP 124 and/or read the TAP 124 and, for example, transmit information based at least in part on reading the TAP 124 to an external device, network, etc. via the interface 160.

The board 101 differs from that of a board of a conventional computing device. For example, a conventional computing device (e.g., a phone, a tablet, a notebook computer, a desktop computer, etc.) may include a conventional processor chip where the TAP architecture of that processor chip is a "vestigial" structure. To clarify, when one considers the "evolutionary process" of a processor chip, its TAP architecture may only serve a purpose (e.g., testing) prior to installation of the processor chip into a computing device (e.g., installation of the processor chip onto a board such as a motherboard) and, once in the computing device, the TAP architecture of the processor chip may serve no purpose (e.g., no function). Accordingly, the TAP architecture of a processor chip installed in a computing device may be referred to as a vestigial structure.

As an example, a chip (e.g., an integrated circuit chip) can include a TAP architecture for purposes of testing the chip prior to installation of the chip into a computing device. Such testing traditionally involves use of a so-called "bed-of-nails" tester. A traditional bed-of-nails tester is an electronic test fixture that has numerous pins inserted into holes that are aligned using tooling pins to make contact with test points on a chip and are also connected to a measuring unit by wires. A traditional bed-of-nails tester can include an array of small, spring-loaded pogo pins where each pogo pin makes contact with one node (e.g., ball or pin) of the chip-under-test. By pressing the chip-under-test down against the array, reliable contact can be made with hundreds or even thousands of individual test points of the chip-under-test. The hold-down force may be provided manually or by means of a vacuum, thus pulling the chip-under-test downwards onto the array (e.g., bed-of-nails). As an example, another type of array may include silicon test nails (e.g., a silicon test nail bed-of-nails tester).

In the example of FIG. 1, the board 101 is configured for use of the TAP architecture of the processor chip 102 by the controller 150, which may be operatively coupled to the interface 160, for example, for purposes of communication via a network. In such an example, the board 101 as installed in a computing device may be subject to remote analysis based at least in part on the TAP architecture. As an example, the board 101 may be a motherboard of a server (e.g., in a server farm) where the interface 160 allows a server management service implemented by one or more other computing devices to communicate with the controller 150, which may be a baseboard management controller (BMC). In such an example, the communication may be out-of-band in that it does not rely on a conventional operating system environment (e.g., WINDOWS® OS, APPLE® OS, ANDROID® OS, etc.) but rather on a real-time operating system (RTOS) environment established by the controller 150.

As an example of a RTOS, consider the NUCLEUS® RTOS marketed by Mentor Graphics (Wilsonville, Oreg.), which may also be referred to as an embedded OS. As an example, the NUCLEUS® RTOS, which includes a real-time kernel, may be scaled down to a memory footprint as small as 13 KB for both code and data. As an example, the NUCLEUS® RTOS can operate in conjunction with a so-called EDGE Suite of tools (e.g., for simulation and testing, profiling and JTAG related operations), an integrated development environment (IDE), a compiler and a debugger.

As an example, a RTOS may operate using a reduced instruction set computing architecture (e.g., RISC architecture) and firmware (e.g., a RTOS RISC OS). As an example, a controller may include an embedded RTOS.

As an example, a RTOS may include code for a real-time kernel, storage and networking and connectivity as well as, for example, optionally one or more of a user interface, USB connectivity, a database, graphics and multimedia.

In the example of FIG. 1, where the controller 150 provides for real-time functionality (e.g., via a RTOS), as an example, information concerning the processor 110 of the processor chip 102 may be gathered in real-time. For sake of comparison, an operating system such as the WINDOW® 8 OS (e.g., a full OS), does not provide processor information in real-time but rather with delay (e.g., latency), for example, due in part to reliance application programming interface (API) calls (e.g., a code-heavy interface disposed between a user and a processor). As an example, consider the various processor-related "WINAPI" calls, which may return values with latency of the order of milliseconds.

As an example, the TAP architecture of the processor chip 102 of the board 101 may provide for a boundary scan method. For example, the Joint Test Action Group (JTAG) developed a specification for boundary scan testing that was standardized in 1990 as the IEEE Std. 1149.1-1990. In 1994, a supplement that contains a description of the Boundary Scan Description Language (BSDL) was added that describes the boundary-scan logic content of IEEE Standard 1149.1 compliant devices.

As shown in the example of FIG. 1, the TAP 124 of the processor chip 102 can include a test clock interface (TCK) that provides for clock input for the TAP 124, a test data in (TDI) interface that provides for transfers of serial test data into the processor chip 102, a test data out interface (TDO) that provides for transfers of serial test data out of the processor chip 102, a test mode select interface (TMS) that provides for a signal that may be used by one or more debugging tools, and, optionally, a test reset interface (TRST) that provides for resetting the TAP logic 140.

Given the TAP 124 of the TAP architecture, a method, such as a boundary scan method, may be performed, for example, to test one or more interconnects (e.g., optionally including one or more clusters of logic, memories, etc.). In the example of FIG. 1, the boundary scan cells 128 include individual cells, for example, where each of the individual cells is connected to a respective pin (e.g., or "ball") of the processor chip 102 (e.g., noting that tri-state or other pins may be associated with more than one cell). As an example, each cell may optionally be individually programmed via the TAP architecture to drive a signal onto a pin to perform an individual trace with respect to the processor chip 102. As an example, such a trace may be performed with respect to one or more components operably coupled to the processor chip 102 (e.g., one or more components mounted on a board to which the processor chip 102 may also be mounted). In such an example, the cell at the destination of the trace may be read, for example, to verify whether the trace properly connects the pin of the processor chip 102 to another component (e.g., a pin of the other component). In such an example, if the trace is shorted to another signal or if the trace is open, the correct signal value may not show up at the destination pin, indicating a fault. For example, consider the processor chip 102 as including a pin operatively coupled to a pin of a fan controller that controls a fan to cool the processor 110 where if a trace for the pin of the processor chip 102 results in an incorrect signal, one may conclude that an issue may exist with the fan controller (e.g., a fault).

As another example, a boundary scan method may include capturing the state of one or more pins at an instant in time, with respect to time, etc. For example, the processor chip 102 may include over one hundred pins where each pin has at least one associated boundary scan cell. A boundary scan method may capture values (e.g., states) for all of the pins at an instant in time, which, in turn, may be analyzed to assess operation of the processor 110 of the processor chip 102 and/or one or more components operatively coupled to the processor 110. As an example, an analysis may be for one or more purposes such as, for example, debugging, monitoring, etc.

As an example, the controller 150 may call for a boundary scan using the TAP architecture of the processor chip 102. In such an example, the controller 150 may be instructed via one or more commands received via the interface 160, for example, via one or more networks where the one or more commands originate from a remote location (e.g., a location remote from the board 101). As an example, the controller 150 may include logic that calls for a boundary scan, for example, based on a trigger where the trigger may be a time, trigger, an event trigger or other type of trigger. For example, the controller 150 may include a program that executes in a RTOS environment established by the controller 150 to call for a boundary scan of the processor chip 102 responsive to a trigger, an analysis of a prior boundary scan, etc.

As an example, a boundary scan result may be provided in the form of a file, a package, etc. For example, the controller 150 may receive raw boundary scan values (e.g., register values) from the TAP architecture of the processor chip 102 and format or otherwise package these values for storage, transmission, etc. (e.g., according to a file specification, a transmission protocol, etc.).

As an example, the controller 150 may transmit a boundary scan result to the interface 160, which may be operatively coupled to a network that transmits the boundary scan result to another device. As an example, the controller 150 may analyze a boundary scan result and determine, based at least in part on the analysis, whether to transmit the boundary scan result or information based thereon to the interface 160.

As an example, the controller 150 may include one or more addresses (e.g., network addresses organized in a look-up table). In such an example, the controller 150 may receive a boundary scan result from the TAP architecture of the processor chip 102 and communicate the boundary scan result or information based thereon to at least one of the one or more addresses. For example, a boundary scan result may indicate that an issue exists with the processor chip 102 and/or one or more components operatively coupled thereto. In such an example, the controller 150 may include logic to assess the issue as being of a certain type of issue. In turn, the controller 150 may associated that type of issue with at least one address for transmission of information to that address via the interface 160. As an example, consider a power related issue associated with a lithium-ion power cell (e.g., power cell circuitry operatively coupled to the processor chip 102). In such an example, the controller 150 may include an address for power related issues where upon detection of the power related issue the controller 150 transmits an issue notice to that address (e.g., via the interface 160). As an example, the address may be associated with a facilities manager of a server facility responsible for handling power related issues. As an example, other types of issues may include temperature related issues, memory related issues, network related issues, demand related issues, software related issues (e.g., including firmware related issues), graphics related issues, etc.

As an example, the controller 150 may call for transmitting values to at least some of the boundary scan cells 128 of the processor chip 102, for example, to force data into the processor chip 102 to set up a test (e.g., test state or test condition(s)). In such an example, relevant states may then be fed back to the controller 150, for example, for analysis and/or for transmission of information based at least in part thereon by the controller 150. Such an approach may provide for analyzing various components of a computing device that includes the board 101, for example, without a need for manipulation of physical probes (e.g., by hand).

As an example, the controller 150 may include a set of boundary scan test vectors stored in memory of the controller 150 (e.g., or otherwise accessible by the controller 150), for example, which may be accessed to perform particular tests. As an example, the controller 150 may receive via the interface 160 one or more boundary scan test vectors, for example, to allow the controller 150 to perform one or more associated tests. For example, a manager at a remote location may wish to assess the board 101 by having a particular test performed. In such an example, the manager may use a computing device operatively coupled to a network to transmit a boundary scan test vector to the interface 160 of the board 101 and subsequent transmission to the controller 150. In turn, the controller 150 can transmit the received boundary scan test vector to the processor chip 102 via the TAP 124 and, for example, receive a boundary scan result (e.g., or results) responsive to the test via the TAP 124.

As an example, a boundary scan result may be as follows:
"541 (bc_1, *, control, 1)," &
"542 (bc_1, GPIO51_ATACS1, output3, X, 541, 1, Z)," &
"543 (bc_1, GPIO51_ATACS1, input, X)," &
"544 (bc_1, *, control, 1)," &
"545 (bc_1, GPIO50_ATACS0, output3, X, 544, 1, Z)," &
"546 (bc_1, GPIO50_ATACS0, input, X)," &

In such an example, GPIO refers to a general purpose input/output ball or pin, for example, which may be programmed (e.g., provided a value). The foregoing the boundary scan result example shows six lines that reference two balls (e.g., GPIO50 and GPIO51) of a chip, each of which has three components in a boundary scan register (BSR): a control configuring the ball (as input, output, what drive level, pullups, pulldowns, etc.); one type of output signal; and one type of input signal. The foregoing example is merely provided to illustrate types of information that may be included in a boundary scan result.

Figure 2:
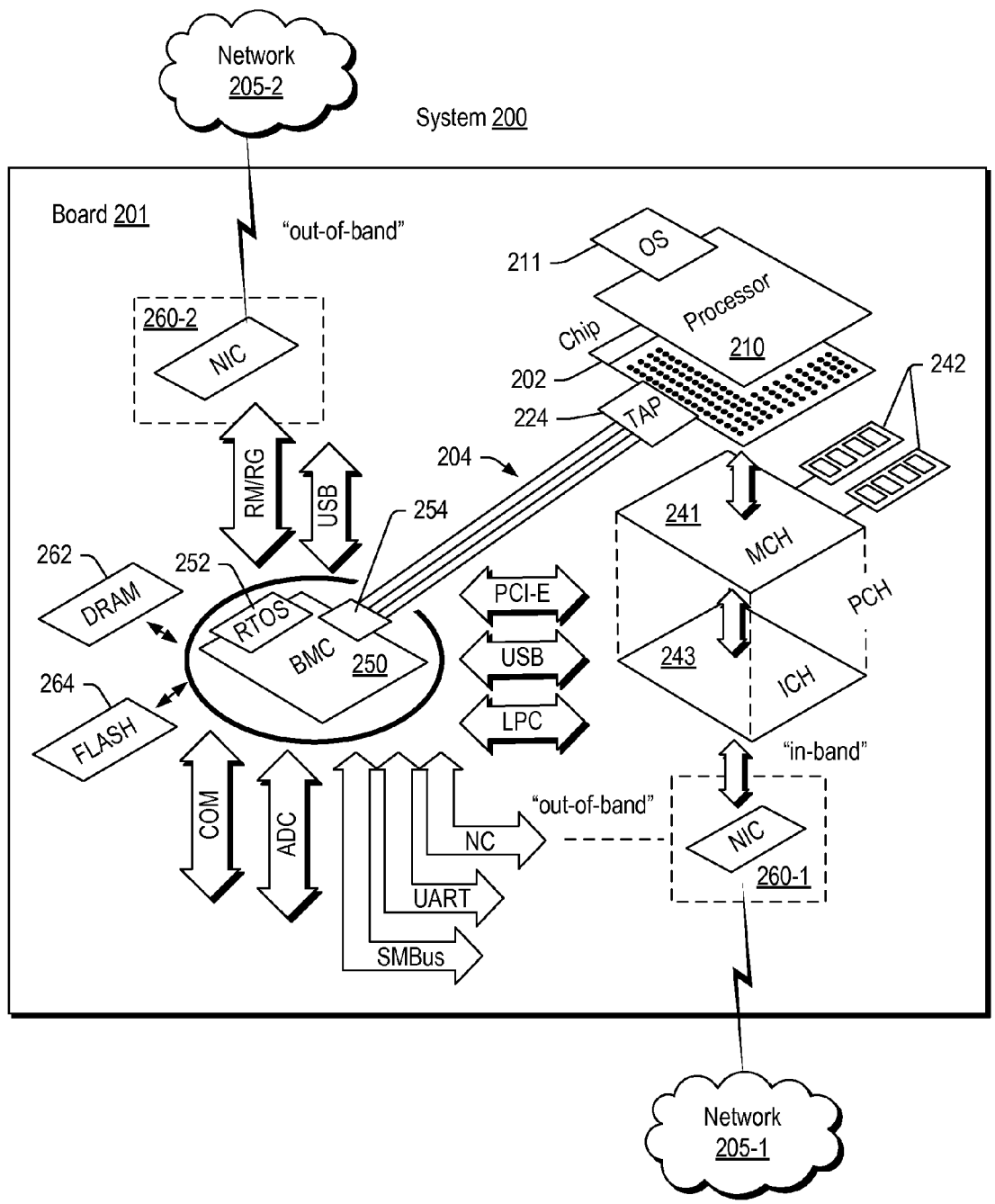
FIG. 2 is a diagram of an example of a system.

FIG. 2 shows an example of a system 200 that includes a board 201 for a processor chip 202 and a controller 250, which may be referred to as a baseboard management controller (BMC). In the example of FIG. 2, the controller 250 and the processor chip 202 are operatively coupled via wires 204 and interfaces 224 and 254 where, for example, the interface 224 may be or includes a TAP (see, e.g., the TAP 124 of FIG. 1). As an example, the interface 254 may include circuitry, for example, to direct signals (e.g., to the interface 224 and/or from the interface 224). As an example, the interface 254 may be a separate component operatively coupled to the controller 250 (e.g., via an interface that may be a native interface of the controller 250).

In the example of FIG. 2, the board 201 is also configured for so-called "in-band" and "out-of-band" communication via a network 205-1 and/or via a network 205-2, which may differ from the network 205-1, include the network 205-1 or be the network 205-1.

As shown in the example of FIG. 2, the processor chip 202 includes a processor 210 (e.g., including one or more cores) that may execute an operating system 211, for example, to establish an operating system environment. In the example of FIG. 2, the processor chip 202 is operatively coupled to a memory controller host (MCH) 241 and an input/output controller housing (ICH) 243, which may be, for example, components of a platform controller host (PCH). The MCH 241 is operatively coupled to system memory 242 and the ICH 243 is operatively coupled to a network interface controller (NIC) 260-1. As an example, the components illustrated as a vertical stack may be considered "host" components that support the establishment of an operating system environment using the processor 210, for example, to execute applications (e.g., and for in-band communications).

In the example of FIG. 2, the controller 250 includes a RTOS 252 and various interfaces. As an example, the controller 250 may include dedicated network support, for example, via an optional NIC 260-2. As an example, the NIC 260-1 and/or the NIC 260-2 may provide for out-of-band (OOB) communication with the controller 250 (e.g., via the network 205-1 and/or the network 205-2). As an example, a controller may include an IP address, for example, that may differ from an IP address associated with host components on a board. In the example of FIG. 2, the controller 250 may also include interfaces to access components such as, for example, DRAM 262, flash 264 (e.g., optionally SPI flash), etc. The controller 250 may include interfaces for communication with one or more of the MCH 241 and the ICH 243, for example, via a PCI-express interface (PCI-E), a USB interface, a low pin count interface (LPC), etc. The controller 250 may include an interface configured in compliance with a SMB specification (e.g., a "SMBus" specification). Such an interface may be configured for communications, control, data acquisition, etc. with one or more components on a motherboard (e.g., power related components, temperature sensors, fan sensors, voltage sensors, mechanical switches, clock chips, etc.).

As an example, the controller 250 may be optionally compliant with an Intelligent Platform Management Interface (IPMI) standard. The IPMI may be described, for example, as a message-based, hardware-level interface specification. In a system, an IPMI subsystem may operate independently of an OS (e.g., host OS), for example, via out-of-band communication. The IPMI may be suitable for use by a system administrator, for example, to perform out-of-band management of a system (e.g., monitoring operation, etc.).

In the example of FIG. 2, an OS environment may be established using, for example, a WINDOW® OS (e.g., a full OS), an APPLE® OS, an ANDROID® OS or other OS capable of establishing an environment for execution of applications (e.g., word processing, drawing, email, etc.). As an example, the controller 250 may establish an RTOS such as, for example, the NUCLEUS® RTOS, a RISC OS, an embedded OS, etc.

As an example, the controller 250 may be an ARC controller that can function as a baseboard management controller (BMC) (e.g., an ARC4 processor with an I-cache, a D-cache, SRAM, ROM, etc.). As an example, a BMC may include an expansion bus, for example, for an external flash PROM, external SRAM, and external SDRAM. A BMC may be part of a management microcontroller system (MMS), which, for example, operates using firmware stored in ROM (e.g., optionally configurable via EEPROM, strapping, etc.).

As an example, the controller 250 may be an ARM controller that includes an ARM architecture, for example, consider a controller with an ARM926 32-bit RISC processor. As an example, a controller with an ARM architecture may optionally include a Jazelle® technology (ARM Limited, Cambridge, UK) enhanced 32-bit RISC processor with flexible size instruction and data caches, tightly coupled memory (TCM) interfaces and a memory management unit (MMU). In such an example, separate instruction and data AMBA® AHB™ interfaces suitable for multi-layer AHB based systems may be provided. The Jazelle® DBX (Direct Bytecode eXecution) technology, for example, may provide for execution of bytecode directly in the ARM architecture as a third execution state (and instruction set) alongside an existing mode.

As an example, the controller 250 may be configured to perform tasks associated with one or more sensors (e.g., scanning, monitoring, etc.), for example, as part of an Intelligent Platform Management Interface (IPMI) management scheme. As an example, a sensor may be or include hardware sensor (e.g., for temperature, etc.) and/or a software sensor (e.g., for states, events, etc.). As an example, a controller (e.g., a BMC) may provide for out-of-band management of a computing device (e.g., an information handling system), for example, via a network interface.

As an example, a controller may be configured to implement one or more server-related services. For example, a system may include a server management mode (SMM) interface managed by a BMC. In such an example, the BMC may prioritize transfers occurring through the SMM interface. In such an example, the BMC may act as a bridge between server management software (SMS) and IPMI management bus (IPMB) interfaces. Such interface registers (e.g., two 1-byte-wide registers) may provide a mechanism for communications between the BMC and one or more host components.

As an example, the NIC 260-1 of the system 200 of FIG. 2 may be a LAN subsystem PCI bus network adapter configured to monitor network traffic, for example, at a so-called Media Independent Interface. Upon detecting a particular packet frame (e.g., in a "magic" packet), a NIC may assert a wake-up signal, for example, that powers up a device (e.g., an information handling device such as a computer). While a magic packet is mentioned, wake capabilities may occur, for example, responsive to receipt of a PCI Express WAKE# signal, a ping, etc. For example, reception of a network wake-up packet (e.g., magic or other), detection of a link change of state, etc. may result in waking. While LAN is mentioned, as an example, a signal (e.g., a command, a packet or other information) may be received via cellular circuitry, infra-red circuitry or other type of communication circuitry.

As an example, a NIC may include various features, for example, a network adapter may include a Gigabit Ethernet controller, a RJ-45 LAN connector, a CSMA/CD protocol engine, a LAN connect interface between a PCH and a LAN controller, PCI bus power management, ACPI technology support, LAN wake capabilities, ACPI technology support, LAN subsystem software, etc.

As an example, a network adapter may be chip-based with compact, low power components with Gigabit Ethernet Media Access Control (MAC) and Physical Layer (PHY) port. Such a network adapter may use the PCI Express (PCIe) architecture, for example for implementation as a LAN on a motherboard (LOM) configuration or, for example, embedded as part of a switch add-on card, a network appliance, etc. (e.g., consider a NIC-based controller for a NIC of a motherboard).

As an example, the board 201 may include components such as those marketed by Intel Corporation (Santa Clara, Calif.). As an example, one or more components may support the Intel® Active Management Technology (AMT), as a hardware-based technology for remotely managing and securing computing systems in out-of-band operational modes. Intel® AMT is a set of remote management and security features designed into hardware that can, for example, allow a system administrator with AMT security privileges to access system information and perform specific remote operations on a system that includes the hardware. As an example, such remote operations may include remote power up/down (e.g., via wake on LAN), remote/redirected boot (e.g., via integrated device electronics redirect, or IDE-R), console redirection (e.g., via serial over LAN), and other remote management and security features.

As an example, a network adapter may include one or more features of an Intel® Ethernet controller, for example, as described in a document entitled "Intel® 82583V GbE Controller" (Rev. 2.5, June 2012), which is incorporated by reference herein.

As an example, a controller may store configuration information in protected memory (see, e.g., the DRAM 262, the flash 264, etc.). As an example, the information may include the name(s) of appropriate "whitelist" management servers (e.g., for a company, etc.).

As an example, the controller 250 may be operable in part by using instructions stored in memory such as the DRAM 262 and/or the flash 264. As an example, such instructions may provide for implementation of one or more methods that include monitoring, assessing, etc. operation of the processor chip 202 by the controller 250 at least in part by transmitting and/or receiving signals via the TAP 224 of the processor chip 202.

As an example, the controller 250 may implement one or more methods based at least in part on information received via an out-of-band communication path. For example, a command may be received via the out-of-band communication path of the system 200 that calls for monitoring, assessing, etc. the system 200 by the controller 250 based at least in part on transmitting and/or receiving signals via the TAP 224 of the processor chip 202. As an example, the controller 250 may initiate out-of-band or other communication based at least in part on transmitting and/or receiving signals via the TAP 224 of the processor chip 202. For example, where a fault has been detected via a boundary scan method using boundary scan cells of the processor chip 202, the controller 250 may transmit a fault notice via the out-of-band path or, optionally, via the in-band path of the system 200. For example, where communication may be via an email application that executes in an OS environment of the system 200, the controller 250 may optionally invoke that email application to send an email (e.g., a fault notice email, etc.).

As an example, the system 200 may be part of a server. For example, consider a RD630 ThinkServer® system marketed by Lenovo (US) Inc. of Morrisville, N.C. Such a system may include, for example, multiple sockets for processors (see, e.g., FIG. 8). As an example, a processor may be an Intel® processor (e.g., XEON® E5-2600 series, XEON® E3-1200v3 series (e.g., Haswell architecture), etc.). As an example, a server may include an Intel® chipset, for example, such as one or more of the Intel® C6XX series chipset. As an example, a server may include RAID hardware (e.g., adapters). As an example, a server may include hypervisor instructions for establishing a hypervisor environment, for example, to support virtual OS environments, etc.

Figure 3:
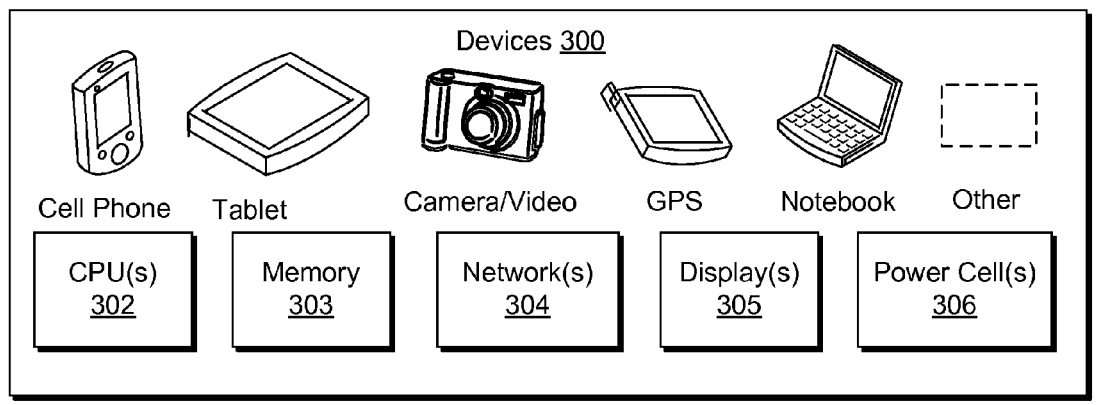
FIG. 3 is a diagram of example of devices and an example of a system.
Figure 3:
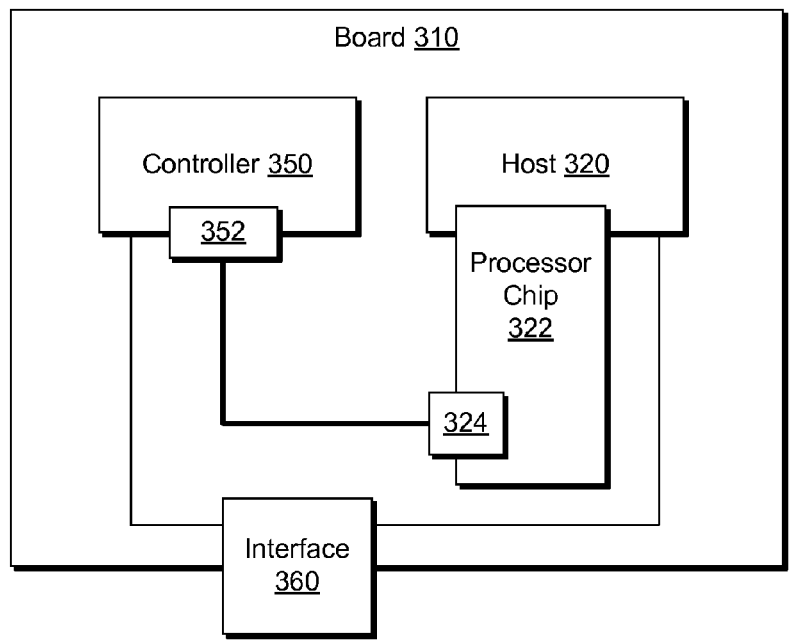

FIG. 3 shows some examples of devices 300 and an example of a system 308. As shown, each of the devices 300 may include one or more processors 302, memory 303, one or more network interfaces 304, one or more displays 305 and one or more power cells 306. As an example, a cell phone, a tablet, a camera, a GPS device, a notebook computer, or other device may include a controller configured to interact with a processor chip via a TAP architecture of the processor chip. As an example, one or more of the devices may include a system that may include various features of the system 308.

As shown in the example of FIG. 3, the system 308 includes a host 320, a controller 350 and an interface 360. In the example of FIG. 3, the interface 360 may direct communications to the host 320 (e.g., in-band) and/or to the controller 350 (e.g., out-of-band). Also shown in FIG. 3, the host 320 includes a processor chip 322 (e.g., with one or more processors) with a TAP 324 for a TAP architecture of the processor chip 322 and the controller 350 includes an interface 352 that may be, for example, directly or indirectly coupled to the TAP 324.

As an example, a controller may be mounted on a board (e.g., a motherboard) as a separate chip (e.g., a separate ARC chip, ARM chip, etc.) or may be embedded in a chipset mounted on a board (e.g., an embedded ARC chip, an embedded ARM chip, etc.). As an example, a controller may be a BMC and may be mounted directly or indirectly on a motherboard (e.g., indirectly as part of a chipset, directly as a chip, etc.). For example, the controller 150 of FIG. 1 may itself be mounted on the board 101 (e.g., as a separate component) or may be mounted on a chipset mounted on the board 101 (see also, e.g., the controller 250 of FIG. 2). In either configuration, such a controller may be operatively coupled to a TAP of a processor chip that includes a TAP architecture, for example, where the processor chip and the controller are mounted to the same board.

As an example, the controller 350 may include an ARC processor (e.g., an ARC-based controller) or an ARM processor (e.g., an ARM-based controller). As an example, one or more technologies (e.g., such as those of the Intel® AMT and/or other) may be implemented using the controller 350.

In the example of FIG. 3, the interface (e.g., a network interface) 360 may be configured to identify out-of-band (OOB) network traffic (e.g., traffic targeted to a controller, etc.) and route it to the controller 350. As an example, controller destined traffic may be identified by one or more dedicated IANA-registered port numbers.

In the example of FIG. 3, a cellular network connector may be included alternatively or additionally to the interface 360. As an example, a cellular network connector may include a connection to the interface 360. As an example, an out-of-band process may optionally be initiated via a communication received via a cellular network connector. For example, a cellular network connector may sniff packets for particular identifying information (e.g., consider a 3G, 4G, etc., cellular network sniffer).

As an example, an apparatus can include a circuit board; a processor chip mounted to the circuit board that includes a Test Access Port (TAP); a controller mounted to the circuit board that includes a port (e.g., interface) operatively coupled to the Test Access Port (TAP) of the processor chip; and a network interface operatively coupled to the controller. As an example, a port of a controller may be operatively coupled to a TAP of a processor chip via wires. As an example, a processor chip can include at least one processor.

Figure 8:
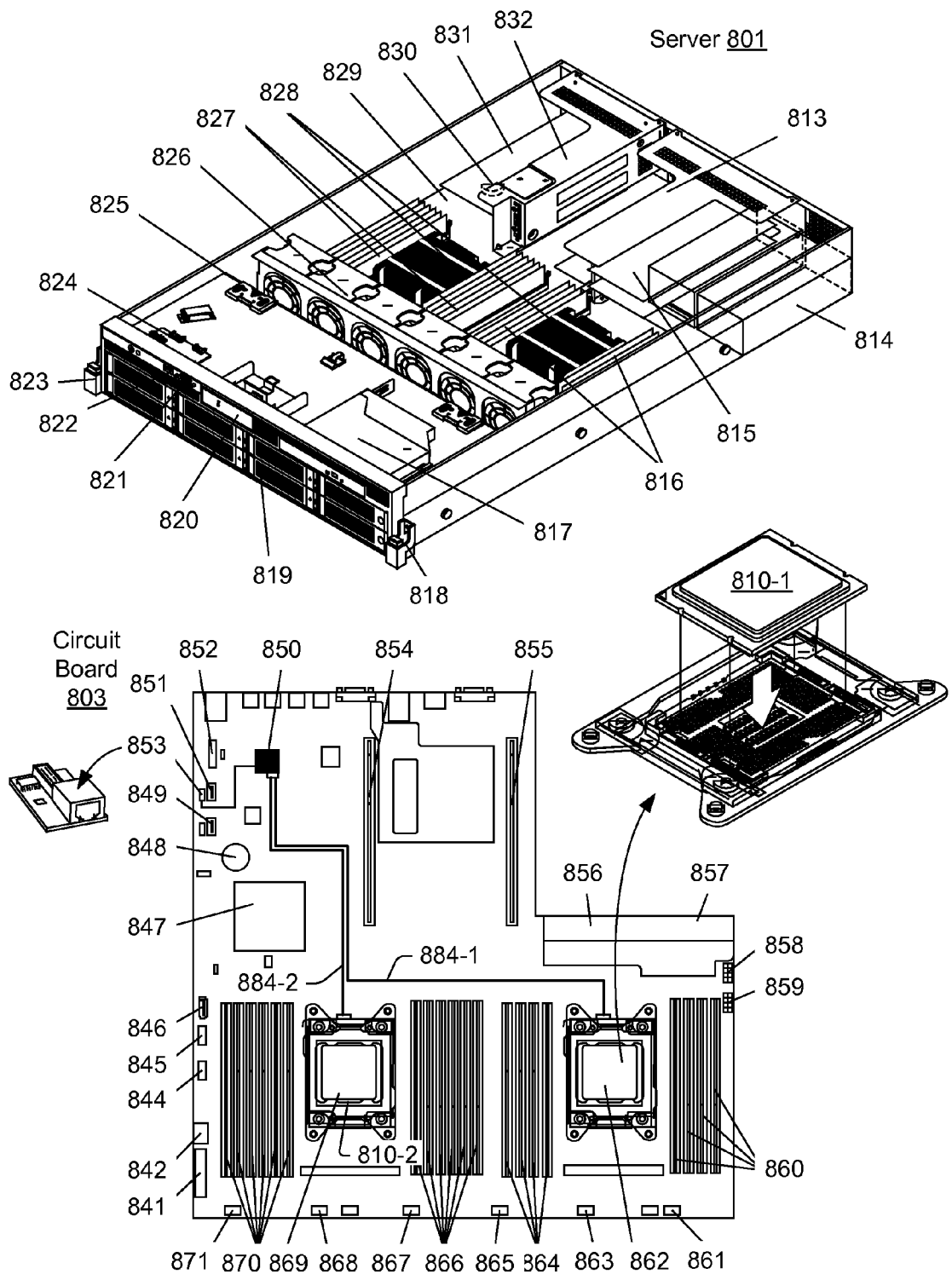
FIG. 8 is a diagram of an example of a server and an example of a board with various components.

As an example, where a board (e.g., a circuit board) may include multiple processor chips, each with a respective TAP, a controller may be configured to selectively transmit and/or receive information from one or more of the TAPs (e.g., via multiple lines, multiplexer circuitry, etc.; see, e.g., FIG. 8). As an example, a controller may be configured to selectively monitor, test, halt, etc. one or more processors, for example, via respective TAPs. As an example, where a processor chip includes a processor with multiple cores, a controller may optionally individually monitor, test, halt, etc. each of the multiple cores. As an example, where a processor chip includes on-board memory, a controller may optionally monitor, test, halt use of, etc. such on-board memory (e.g., optionally on a selective basis).

As an example, a TAP can include a Test Data Input (TDI) connector, a Test Data Output (TDO) connector, a Test Clock (TCK) connector, and a Test-Mode Select (TMS) connector. As an example, a TAP architecture can include a TAP state machine (e.g., TAP logic). In such an example, a controller may selectively use the TAP state machine, for example, to monitor, test, halt, etc. one or more operations associated with a chip that includes the TAP state machine.

As an example, a controller may access memory that stores instructions for a real-time operating system (RTOS). For example, such memory may store application instructions for execution on a RTOS environment established by the controller using the RTOS where, for example, the application instructions can call for transmission of signals by the controller to the Test Access Port (TAP) of a processor chip (e.g., from a port or interface of the controller to the TAP of the processor chip).

As an example, a controller may be or include a baseboard management controller (BMC). As an example, a network interface may be operatively coupled to a controller configured for out-of-band communication.

As an example, an apparatus may include two or more processor chips where each processor chip includes its own Test Access Port (TAP) and where a port (e.g., or interface) of a controller may be selectively operatively couplable to the Test Access Port (TAP) of each of the processor chips.

As an example, an apparatus can include a host chip where, for example, a controller is embedded on the host chip. As an example, a host chip may be a memory controller hub or host chip (MCH), an I/O controller hub or host chip (ICH), a platform controller hub or host chip (PCH), etc. As an example, a controller may be separate from a host chip, for example, consider an Aspeed® AST1XXX or 2XXX series controller marketed by Aspeed Technology Inc. (Hsinchu, T W). In such an example, wires may operatively couple the controller to a TAP of a processor chip associated with or part of the host chip (e.g., for a processor that may establish an OS "host" environment for "hosting" of applications).

Figure 4:
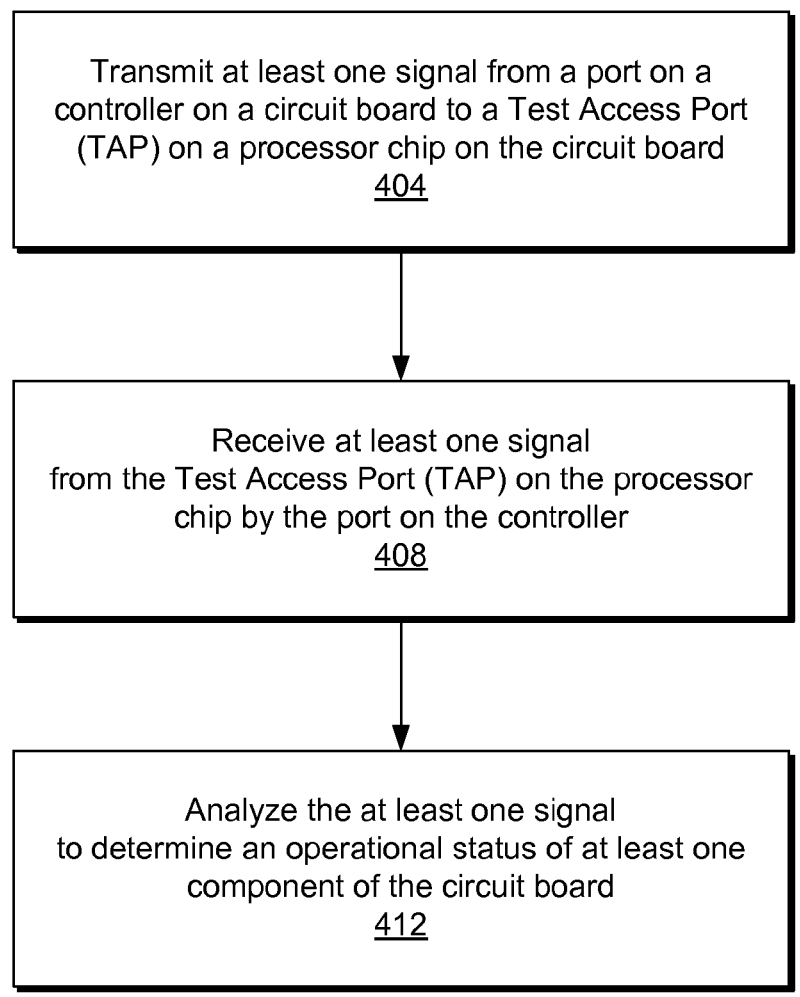
FIG. 4 is a diagram of an example of a method.

FIG. 4 shows an example of a method 400 that includes a transmit block 404 for transmitting at least one signal from a port on a controller on a circuit board to a Test Access Port (TAP) on a processor chip on the circuit board; a reception block 408 for receiving at least one signal from the Test Access Port (TAP) on the processor chip by the port on the controller; and an analysis block 412 for analyzing the at least one signal to determine an operational status of at least one component of the circuit board.

As an example, a method may include halting operation of a processor of a processor chip based at least in part on analyzing one or more signals from a TAP of a processor chip.

As an example, a method may include communicating an operational status indicator based at least in part on an operational status determined by analysis of at least one signal from a TAP of a processor chip (e.g., as received by a controller). In such an example, communication may be via a network interface operatively coupled to a circuit board on which the processor chip and a controller reside.

As an example, a method can include receiving a communication from a network interface operatively coupled to a circuit board and transmitting at least one signal based at least in part on the communication from a controller mounted on the circuit board to a TAP of a processor chip mounted on the circuit board. In such an example, the communication received via the network interface may be an out-of-band communication communicated during execution of an operating system environment established at least in part by a processor of the processor chip.

As an example, a method can include transmitting at least one signal from a port (e.g., an interface) on a controller on a circuit board to a TAP on a processor chip, for example, where such a transmission includes transmitting a signal to perform a boundary scan of the processor chip (e.g., using a TAP architecture of the processor chip).

Figure 5:
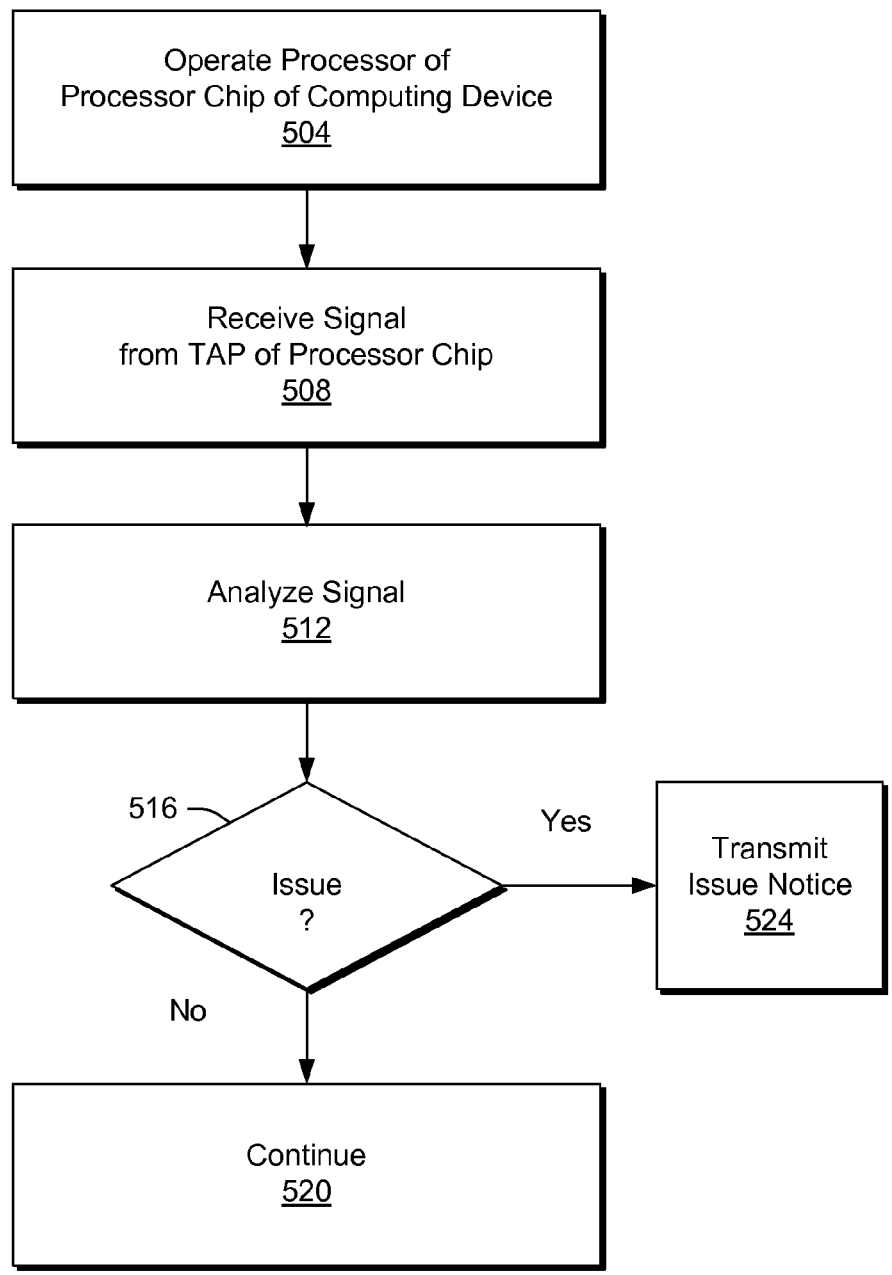
FIG. 5 is a diagram of an example of a method.

FIG. 5 shows an example of a method 500 that includes an operation block 504 for operating a processor of a processor chip of a computing device (e.g., a processor of a processor chip installed on a board of the computing device), a reception block 508 for receiving a signal from a TAP of the processor chip, an analysis block 512 for analyzing the received signal (e.g., by a controller of the computing device mounted on the same board as the processor chip), a decision block 516 for deciding whether an issue exists based at least in part on the analysis of the signal, a continuation block 520 for continuing operation of the processor and a transmission block 524 for transmitting an issue notice. As shown in the example of FIG. 5, if the decision block 516 decides that no issue exists, the method 500 may continue at the continuation block 520; whereas, if the decision block 516 decides that an issue exists, the method 500 may continue at the transmission block 524. As an example, depending on the type of issue (e.g., severity of the issue), the method 500 may continue to the continuation block 520 after transmission of an issue notice per the transmission block 524. As an example, a processor may be continuously used during the method 500 (e.g., optionally during transmission of an issue notice), for example, unless an issue is detected that may call for halting its use of the processor or, for example, calling for the processor to perform a shutdown of a system (e.g., of the computing device).

As an example, the transmission block 524 of the method 500 may transmit an issue notice to a responsible party, for example, based on an address for that party. As an example, such a notice may be transmitted via one or more networks (e.g., wired and/or wireless). As an example, a notice may be transmitted to an email address or other address (e.g., an Internet address).

Figure 6:
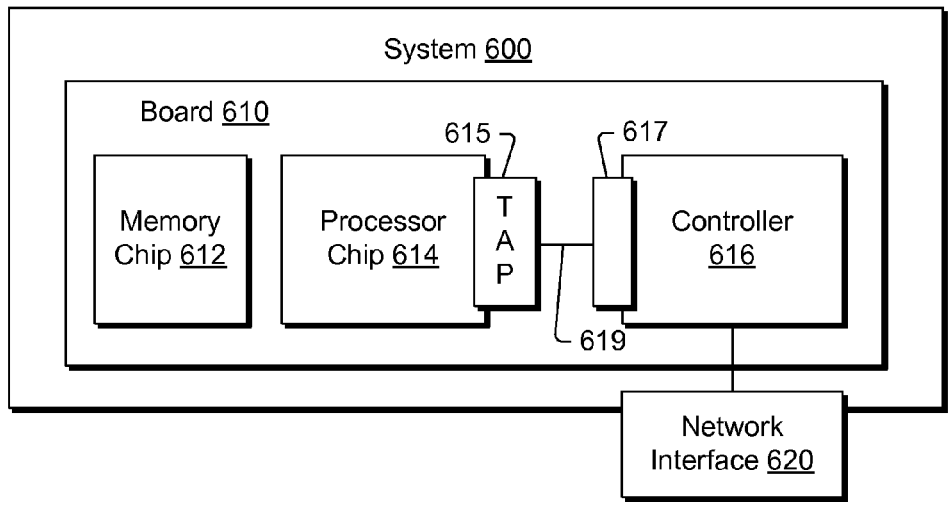
FIG. 6 is a diagram of an example of a system, an example of a server installation and an example of a method.
Figure 6:
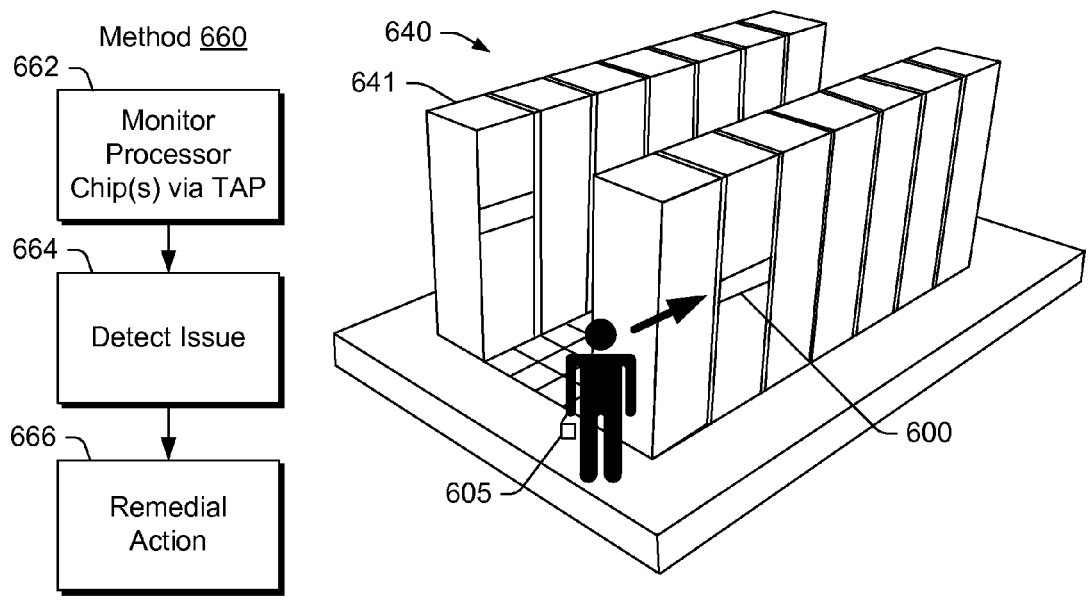

FIG. 6 shows an example of a system 600, a server installation 640 and a method 660. In the example of FIG. 6, the system 600 includes a circuit board 610, at least one memory chip 612 mounted to the circuit board 610 (e.g., via a slot, socket, etc.); a processor chip 614 mounted to the circuit board 610 where the processor chip 614 includes a Test Access Port (TAP) 615; a controller 616 (e.g., a controller chip) mounted to the circuit board 610 where the controller 616 includes a port 617 operatively coupled to the Test Access Port (TAP) 615 of the processor chip 614; and a network interface 620 operatively coupled to the controller 616 for remote monitoring of the system 600 at least in part via communication between the port 617 of the controller 616 and Test Access Port (TAP) 615 of the processor chip 614.

As an example, the system 600 can include wires 619 that electrically connect (e.g., directly or indirectly) the port 617 of the controller 616 (e.g., a controller chip) and the Test Access Port (TAP) 615 of the processor chip 614. As an example, the system 600 may be a server system (see, e.g., FIG. 8). For example, the board 610 may be part of a server system (e.g., a motherboard of a server). As an example, the processor chip 614 may include multiple cores (e.g., for handling information, etc.). As an example, the system 600 may be an information handling system.

As an example, the controller 616 may be a baseboard management controller (BMC) that may include interfaces that can interface with components of a server system. For example, the controller 616 may interface, directly or indirectly, with a RAID adapter, equipment operatively coupled via a RAID adapter, etc. As an example, the controller 616 may process information via the TAP 615 and via one or more other interfaces (see, e.g., the interfaces of the controller 250 of FIG. 2). As an example, a loop (e.g., optionally a feedback loop) may be established for coordinated monitoring, control, management, etc. of one or more functions of a system (e.g., consider a server system). In such an example, a loop may include input and/or output via a network interface (e.g., optionally via an out-of-band path).

In FIG. 6, the server installation 640 includes server racks 641 with servers installed therein. As an example, at least one of the server racks may include a server that includes the system 600 (e.g., at least a board such as the board 610).

In FIG. 6, the method 660 includes a monitor block 662 for monitoring one or more processor chips via TAP, a detection block 664 for detecting at least one issue based at least in part on the monitoring and a remedial action block 666 for calling for and/or taking remedial action, for example, in an effort to resolve a detected issue.

As an example, the server installation 640 may include a management system that is configured to monitor servers via communication with baseboard management controllers in each of the servers where each of the baseboard management controllers includes a port for communication with a TAP of a processor chip. In such an example, the management system can monitor operations of each of the servers via communication with their respective baseboard management controllers (e.g., optionally out-of-band communication). For example, such a management system may call for monitoring by performing period boundary scans via TAP architecture of each of the processor chips. As an example, where an issue is detected based on such monitoring, the management system may call for remedial action in an effort to resolve the detected issue. For example, remedial action may include calling for a test via a TAP of a processor chip, calling for another type of test, calling for a repair person to physically inspect and service a server having the detected issue, etc. In the example of FIG. 6, a repair person is shown with equipment 605, which may be, for example, test equipment for testing a server, a replacement component for a server, etc.

As an example, a detected issue may be amenable to resolution remotely. For example, where an issue is related to BIOS, a remote BIOS update may be performed, for example, using an out-of-band communication path. While BIOS is mentioned as an example, issues with other types of firmware, software, etc. may be amenable to remote resolution.

As an example, a system such as the system 600 may provide for detection of one or more critical hardware failure modes. For example, via TAP-based controller interaction, a method may provide for one or more of detection, in-depth debugging and optionally image reloading or other remedial action. Such an approach may optionally be supplemented with a dump, for example, should a failure occur (e.g., consider analysis of generated system dump files that may capture a system state after a failure has occurred).

Figure 7:
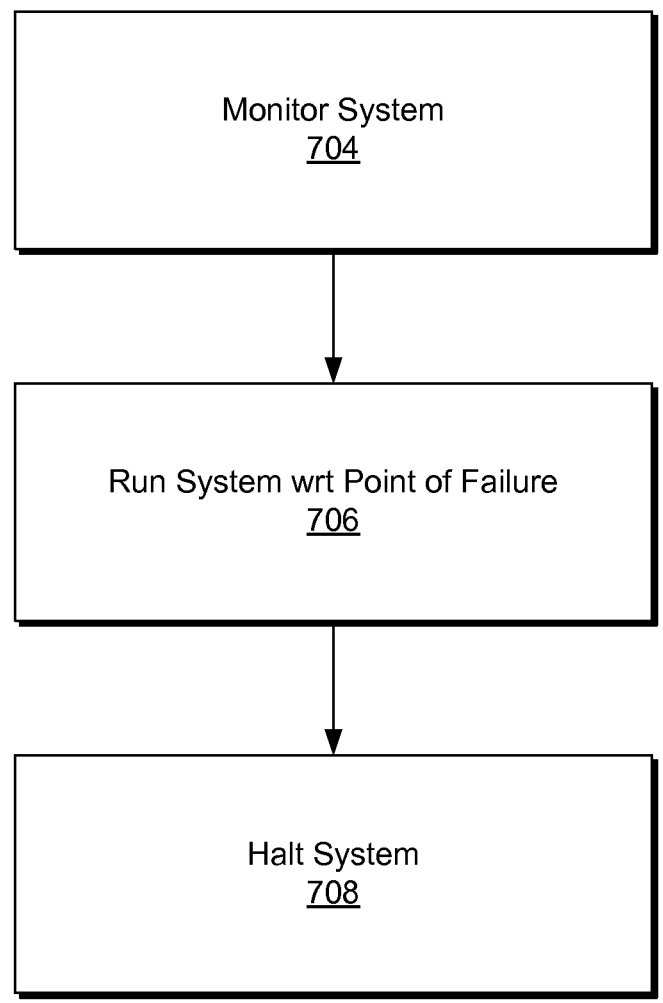
FIG. 7 is a diagram of an example of a method.

FIG. 7 shows an example of a method 700 that includes a monitor block 704 for monitoring a system, a run block 706 for running a system near to or up to a point of failure and a halt block 708 for then halting the system, for example, prior to failure, at the point of failure and/or just after the point of failure. In such an example, a controller (e.g., a baseboard management controller) may provide for monitoring and halting. As an example, a controller may "set" a state of a processor of a system via a TAP where the processor is on a processor chip with a TAP architecture. As an example, where a system includes multiple processor chips, the controller may perform one or more methods with respect to each of the processor chips, for example, independently or in a coordinated manner via a respective TAP of each of the processor chips. As an example, a controller may call for a processor to be "halted" while another processor may continue to execute.

As an example, via a TAP of a processor chip, a controller may be configured to monitor critical system memory or other resources that if accessed in a certain manner may lead to a system crash. When such an access occurs the controller may halt the system just before the crash, which may thereby allow for more detailed capture of a failure event.

As an example, a controller may be used in conjunction with a remote debug station such that a developer can step through code and debug a failure with a system (e.g., optionally operating in a customer's unique environment).

FIG. 8 shows an example of a server 801 and an example of a circuit board 803 that may be part of the server 801. As an example, the server 801 may be installed in a rack such as one of the server racks 641 of FIG. 6.

As shown in the example of FIG. 8, the server 801 can include a riser card assembly 813, one or more hot-swap power supplies 814, one or more PCI-express card 815, a first set of DIMMs 816, an optical drive 817, a right-side rack handle 818, a hard disk drive area 819, a diagnostic module 820, a VGA DB-connector 821, a USB port 822, a left-side rack handle 823, a front panel board 824, a backplane for hard disk drives 825, system fans 826, a second set of DIMMs 827, heat sinks (e.g., with processors beneath) 828, a circuit board (e.g., or system board) 829, a circuit board battery 830, one or more other PCI-express cards 831 and another riser card assembly 832.

As to the circuit board 803, it may be suitable for use as the circuit board 829 of the server 801. As shown in the example of FIG. 8, the circuit board 803 can include a front panel connector 841, an internal USB connector 842, a diagnostic module connector 844, a front VGA connector 845, a SATA connector 846, a platform controller hub (PCH) 847, a circuit board battery 848, an internal USB Type A port 849, a controller 850, another internal USB Type A port 851, a TPM (Trusted Platform Module) connector 852, a controller connector module 853, a riser card assembly slot 854, another riser card assembly slot 855, a power supply connector 856, another power supply connector 857, a backplane power connector 858, another backplane power connector 859, memory slots 860, 864, 866 and 870, system fan connectors 861, 863, 865, 867, 868 and 871 and processor sockets 862 and 869 where each of the processor sockets 862 and 869 may seat a respective processor chip (e.g., with one or more processors or processing cores). For example, FIG. 8 shows a perspective view of the processor socket 862 and a processor chip 810-1; noting that the processor socket 869 may seat a processor chip 810-2. As an example, each of the processor chips 810-1 and 810-2 may include a TAP architecture and a TAP where each of the processor sockets 862 and 869 can mount to the circuit board 803, for example, to operatively couple a respective processor chip seated thereon (e.g., 810-1 and 810-2) to circuits of the circuit board 803. In such an example, each of the processor sockets 862 and 869 can include connectors that connect to a TAP of a respective processor chip seated thereon. Accordingly, each of the processor sockets 862 and 869 may include a TAP connector, for example, that can expose a TAP of a respective processor chip.

As to the controller connector module 853 of the circuit board 803, it may provide for remote "keyboard, video and mouse" (KVM) access and control through the LAN or Internet in conjunction with the controller 850, which may be a baseboard management controller (BMC). As an example, the controller connector module 853 may provide for location-independent remote access to one or more circuits of the circuit board 803, for example, to respond to incidents, to undertake maintenance, etc.

As an example, the controller connector module 853 may include features such as an embedded web server, a soft keyboard via KVM, remote KVM, virtual media redirection, a dedicated NIC, security (e.g., SSL, SSH, KVM encryption, authentication using LDAP or RADIUS), email alert, etc.

In FIG. 8, the example circuit board 803 includes wires 884-1 and 884-2 that operatively couple the controller 850 to a TAP associated with the processor socket 862 and to a TAP associated with the processor socket 869 (e.g., via one or more ports of the controller 850). In such an example, the controller 850, which may be a baseboard management controller (BMC), may transmit information to a TAP, receive information from a TAP, etc. As an example, the controller connector module 853 may include a network interface operatively coupled to the controller 850 (e.g., a controller chip) for remote monitoring of the server 801 at least in part via communication between a port of the controller and a Test Access Port (TAP) of a processor chip (e.g., or TAPs of multiple processor chips). As an example, the controller 850 may be accessible via an out-of-band (OOB) communication path and/or via an in-band communication path. As an example, the controller connector module 853 may provide for out-of-band communication with the controller 850, for example, for communicating commands, information, etc., which may optionally include commands, information, etc. associated with a TAP architecture (e.g., for interaction with a processor chip via a TAP).

As an example, a processor socket may include a connector that may be operatively coupled to a TAP of a processor chip that may be seated in the processor socket. In such an example, the processor socket may include contacts that can contact a TAP of a processor chip and conductors (e.g., strips, wires, etc.) that provide for electrical conduction between the contacts and the connector. As an example, conductors may be provided (e.g., a cable, strips, wires, etc.) to bridge an interface of a controller and a connector of a processor socket for purposes of utilizing a TAP architecture of a processor chip seated in the processor socket. As an example, the circuit board 803 may be a motherboard for a server. As an example, a motherboard may include conductors (e.g., strips, wires, etc.) that provide for direct or indirect electrical connection between an interface of a controller and a TAP of a processor chip, for example, where the processor chip may be operatively coupled to the motherboard via a processor socket and where the processor socket may include circuitry that can operatively couple to the TAP of the processor chip.

Figure 9:
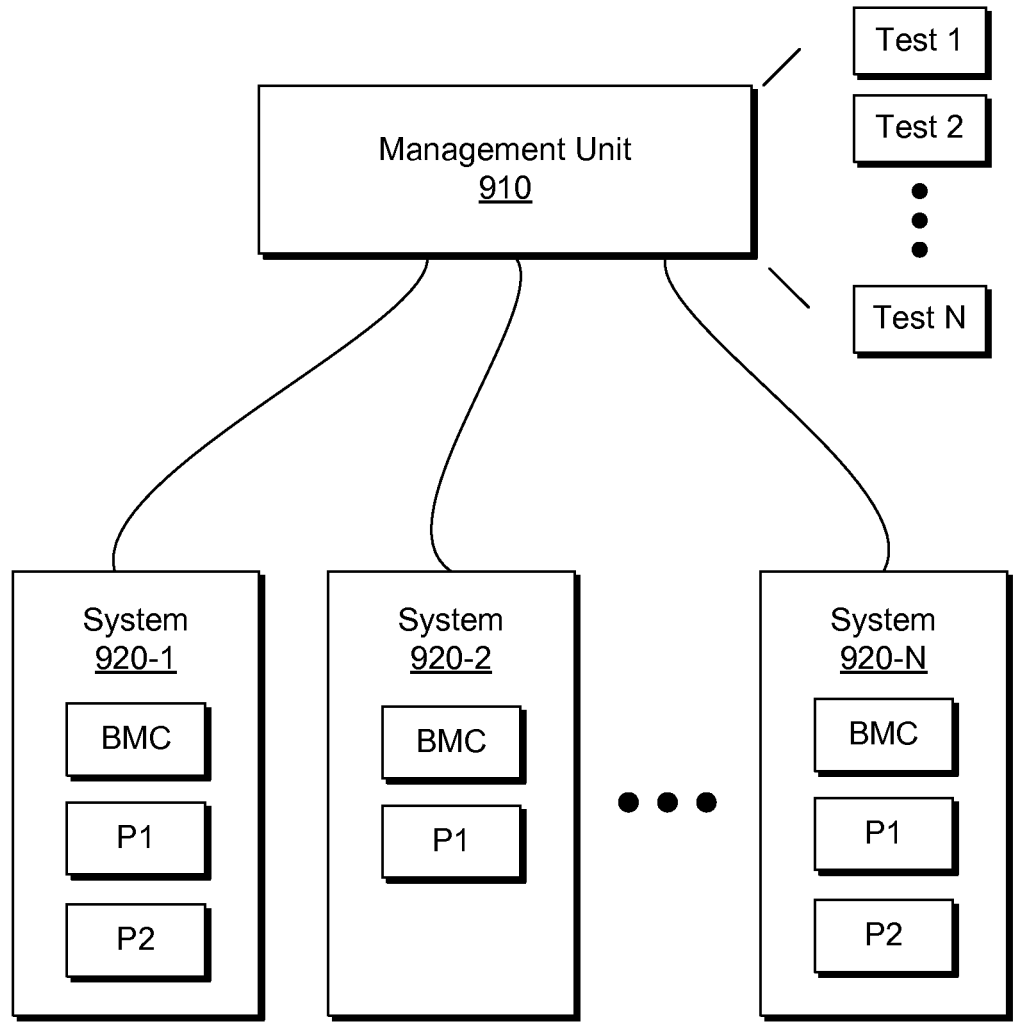
FIG. 9 is a diagram of an example of a management unit and examples of various systems.

FIG. 9 shows an example of a management unit 910 for managing multiple systems 920-1, 920-2, . . . , 920-N. In the example of FIG. 9, each of the systems 920-1 to 920-N includes a baseboard management controller configured to communicate with one or more processor chips (e.g., P1, P2, etc.) via a respective TAP. In the example of FIG. 9, the management unit 910 may be configured for out-of-band communications with each of the systems 920-1 to 920-N. As an example, the management unit 910 may call for performing one or more tests on one or more of the systems 920-1 to 920-N and optionally with respect to one or more of their respective processors.

As an example, the management unit 910 may include test modules (e.g., instructions stored in a computer-readable medium) that are executable by a management service of the management unit 910 to call for performing a test or tests on a system. In such an example, a test may call for transmission and/or receipt of information by a controller (e.g., a baseboard management controller) with respect to a TAP of a processor chip of a system to be tested. As an example, the management unit 910 may communicate with a system or systems using out-of-band communication.

As an example, a system can include a circuit board; at least one memory chip mounted to the circuit board; a processor chip mounted to the circuit board where the processor chip includes a Test Access Port (TAP); a controller mounted to the circuit board where the controller includes a port operatively coupled to the Test Access Port (TAP); and a network interface operatively coupled to the controller for remote monitoring of the system at least in part via communication between the port of the controller and the Test Access Port (TAP) of the processor chip. In such an example, the system can include wires that electrically connect the port of the controller and the Test Access Port (TAP) of the processor chip. As an example, a system may be a server. As an example, a system may include a processor chip that includes a processor that includes at least one core.

As an example, a system may include a hypervisor, for example, executable to manage one or more operating systems. With respect to a hypervisor, a hypervisor may be or include features of the XEN® hypervisor (XENSOURCE, LLC, LTD, Palo Alto, Calif.). In a XEN® system, the XEN® hypervisor is typically the lowest and most privileged layer. Above this layer one or more guest operating systems can be supported, which the hypervisor schedules across the one or more physical CPUs. In XEN® terminology, the first "guest" operating system is referred to as "domain 0" (dom0). In a conventional XEN® system, the dom0 OS is booted automatically when the hypervisor boots and given special management privileges and direct access to all physical hardware by default.

As described herein, various acts, steps, etc., can be implemented as instructions stored in one or more computer-readable storage media. For example, one or more computer-readable storage media can include computer-executable (e.g., processor-executable) instructions to instruct a device. A computer-readable medium may be a computer-readable medium that is not a carrier wave.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Figure 10:
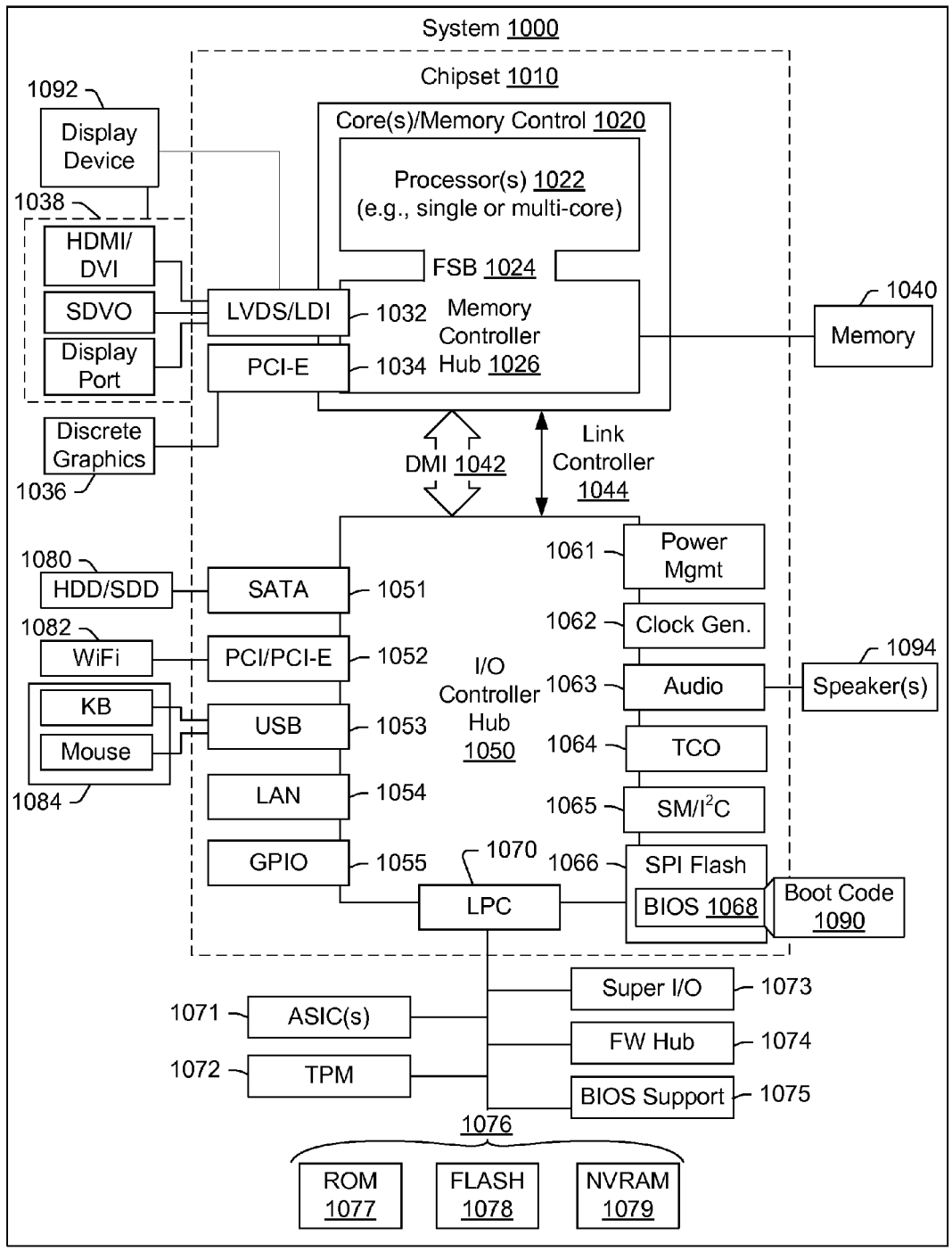
FIG. 10 is a diagram of an example of a machine, some or all of the features thereof may form part or all of a client, a server or other device or system.

While various examples circuits or circuitry have been discussed, FIG. 10 depicts a block diagram of an illustrative computer system 1000. The system 1000 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a satellite, a base, a server or other machine may include other features or only some of the features of the system 1000.

As shown in FIG. 10, the system 1000 includes a so-called chipset 1010. A chipset refers to a group of integrated circuits, or chips, that are designed to work together. Chipsets are usually marketed as a single product (e.g., consider chipsets marketed under the brands Intel®, AMD®, etc.).

In the example of FIG. 10, the chipset 1010 has a particular architecture, which may vary to some extent depending on brand or manufacturer. The architecture of the chipset 1010 includes a core and memory control group 1020 and an I/O controller hub 1050 that exchange information (e.g., data, signals, commands, etc.) via, for example, a direct management interface or direct media interface (DMI) 1042 or a link controller 1044. In the example of FIG. 10, the DMI 1042 is a chip-to-chip interface (sometimes referred to as being a link between a "northbridge" and a "southbridge").

The core and memory control group 1020 include one or more processors 1022 (e.g., single core or multi-core) and a memory controller hub 1026 that exchange information via a front side bus (FSB) 1024. As described herein, various components of the core and memory control group 1020 may be integrated onto a single processor die, for example, to make a chip that supplants the conventional "northbridge" style architecture.

The memory controller hub 1026 interfaces with memory 1040. For example, the memory controller hub 926 may provide support for DDR SDRAM memory (e.g., DDR, DDR2, DDR3, etc.). In general, the memory 1040 is a type of random-access memory (RAM). It is often referred to as "system memory".

The memory controller hub 1026 further includes a low-voltage differential signaling interface (LVDS) 1032. The LVDS 1032 may be a so-called LVDS Display Interface (LDI) for support of a display device 1092 (e.g., a CRT, a flat panel, a projector, etc.). A block 1038 includes some examples of technologies that may be supported via the LVDS interface 1032 (e.g., serial digital video, HDMI/DVI, display port). The memory controller hub 1026 also includes one or more PCI-express interfaces (PCI-E) 1034, for example, for support of discrete graphics 1036. Discrete graphics using a PCI-E interface has become an alternative approach to an accelerated graphics port (AGP). For example, the memory controller hub 1026 may include a 16-lane (×16) PCI-E port for an external PCI-E-based graphics card. A system may include AGP or PCI-E for support of graphics.

The I/O hub controller 1050 includes a variety of interfaces. The example of FIG. 10 includes a SATA interface 1051, one or more PCI-E interfaces 1052 (optionally one or more legacy PCI interfaces), one or more USB interfaces 1053, a LAN interface 1054 (more generally a network interface), a general purpose I/O interface (GPIO) 1055, a low-pin count (LPC) interface 1070, a power management interface 1061, a clock generator interface 1062, an audio interface 1063 (e.g., for speakers 1094), a total cost of operation (TCO) interface 1064, a system management bus interface (e.g., a multi-master serial computer bus interface) 1065, and a serial peripheral flash memory/controller interface (SPI Flash) 1066, which, in the example of FIG. 10, includes BIOS 1068 and boot code 1090. With respect to network connections, the I/O hub controller 1050 may include integrated gigabit Ethernet controller lines multiplexed with a PCI-E interface port. Other network features may operate independent of a PCI-E interface.

The interfaces of the I/O hub controller 1050 provide for communication with various devices, networks, etc. For example, the SATA interface 1051 provides for reading, writing or reading and writing information on one or more drives 1080 such as HDDs, SDDs or a combination thereof. The I/O hub controller 1050 may also include an advanced host controller interface (AHCI) to support one or more drives 1080. The PCI-E interface 1052 allows for wireless connections 1082 to devices, networks, etc. The USB interface 1053 provides for input devices 1084 such as keyboards (KB), mice and various other devices (e.g., cameras, phones, storage, media players, etc.).

In the example of FIG. 10, the LPC interface 1070 provides for use of one or more ASICs 1071, a trusted platform module (TPM) 1072, a super I/O 1073, a firmware hub 1074, BIOS support 1075 as well as various types of memory 1076 such as ROM 1077, Flash 1078, and non-volatile RAM (NVRAM) 1079. With respect to the TPM 1072, this module may be in the form of a chip that can be used to authenticate software and hardware devices. For example, a TPM may be capable of performing platform authentication and may be used to verify that a system or component seeking access is the expected system or component.

The system 1000, upon power on, may be configured to execute boot code 1090 for the BIOS 1068, as stored within the SPI Flash 1066, and thereafter processes data under the control of one or more operating systems and application software (e.g., stored in system memory 1040).

As an example, the system 1000 may include circuitry for communication via a cellular network, a satellite network or other network. As an example, the system 1000 may include battery management circuitry, for example, smart battery circuitry suitable for managing one or more lithium-ion batteries.

CONCLUSION

Although various examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:

1. An apparatus comprising:
   a circuit board;
   a processor chip mounted to the circuit board that comprises a Test Access Port (TAP);
   a controller mounted to the circuit board that comprises a port operatively coupled to the Test Access Port (TAP) of the processor chip via wires wherein the controller assesses information received at least in part via the TAP as to at least one of a plurality of issue types; and
   a network interface operatively coupled to the controller for, at least in part, transmission of one or more issue type notices.

2. The apparatus of claim 1 wherein the controller associates the at least one issue type with at least one of a plurality of addresses for transmission of one or more corresponding issue notices via the network interface.

3. The apparatus of claim 1 wherein the TAP comprises a Test Data Input (TDI) connector, a Test Data Output (TDO) connector, a Test Clock (TCK) connector, and a Test-Mode Select (TMS) connector and wherein the processor chip comprises a TAP state machine.

4. The apparatus of claim 1 wherein the controller accesses memory that stores instructions for a real-time operating system (RTOS).

5. The apparatus of claim 4 wherein the memory stores application instructions for execution on a RTOS environment established by the controller using the RTOS and wherein the application instructions call for transmission of signals by the controller to the Test Access Port (TAP) of the processor chip.

6. The apparatus of claim 1 wherein the controller comprises a baseboard management controller.

7. The apparatus of claim 1 wherein the network interface operatively coupled to the controller is configured for out-of-band communication.

8. The apparatus of claim 1 wherein the processor chip comprises at least one processor.

9. The apparatus of claim 1 comprising an additional processor chip that comprises a Test Access Port (TAP) wherein the port of the controller is selectively operatively couplable to the Test Access Port (TAP) of the additional processor chip.

10. The apparatus of claim 1 comprising a host chip and wherein the controller is embedded on the host chip.

11. A method comprising:
    transmitting, via wires, at least one signal from a port on a controller on a circuit board to a Test Access Port (TAP) on a processor chip on the circuit board;
    receiving at least one signal from the Test Access Port (TAP) on the processor chip by the port on the controller;
    analyzing the at least one signal received by the port on the controller to determine an operational status of at least one component of the circuit board; and
    communicating an operational status indicator based at least in part on the operational status via a network interface operatively coupled to the circuit board.

12. The method of claim 11 further comprising halting operation of a processor of the processor chip based at least in part on the analyzing.

13. The method of claim 11 comprising associating the operational status with one of a plurality of network addresses and wherein the communicating the operational status indicator via the network interface communicates the operational status indicator to the one of the plurality of network addresses.

14. The method of claim 11 further comprising receiving a communication from a network interface operatively coupled to the circuit board and transmitting the at least one signal based at least in part on the communication from the port on the controller to the Test Access Port (TAP).

15. The method of claim 14 wherein the communication comprises an out-of-band communication communicated during execution of an operating system environment established at least in part by a processor of the processor chip.

16. The method of claim 11 wherein the transmitting at least one signal from the port on the controller on the circuit board to the TAP on the processor chip comprises transmitting a signal to perform a boundary scan of the processor chip.

17. A system comprising:
    a circuit board;
    a processor chip mounted to the circuit board wherein the processor chip comprises a Test Access Port (TAP) and wherein the processor chip executes a first operating system to establish a host operating system environment;
    a first network interface for communications with respect to the host operating system environment;
    a controller mounted to the circuit board wherein the controller comprises a port operatively coupled to the Test Access Port (TAP) via wires and wherein the controller executes a second operating system to establish a controller operating system environment; and a second network interface operatively coupled to the controller for communications with respect to the controller operating system environment for remote monitoring of the system at least in part via communication between the port of the controller and the Test Access Port (TAP) of the processor chip.

18. The system of claim 17 comprising a server.

19. The system of claim 17 wherein the processor chip comprises a processor that comprises at least one core.

* * * * *